United States Patent [19]
Fletcher et al.

[11] 3,943,442
[45] Mar. 9, 1976

[54] METHOD AND APPARATUS FOR MEASUREMENT OF TRAP DENSITY AND ENERGY DISTRIBUTION IN DIELECTRIC FILMS

[76] Inventors: James C. Fletcher, Administrator of the National Aeronautics and Space Administration, with respect to an invention of Joseph Maserjian, La Crescenta, Calif.

[22] Filed: Nov. 11, 1974

[21] Appl. No.: 522,551

[52] U.S. Cl. ........ 324/158 R; 324/60 C; 324/158 D; 324/158 T
[51] Int. Cl.² .................. G01R 29/00; G01R 31/00
[58] Field of Search ........ 324/158 D, 158 T, 158 R, 324/61 R, 60 R, 60 C

[56] References Cited
UNITED STATES PATENTS
3,859,595  1/1975  Lang .............................. 324/158 D OTHER PUBLICATIONS
Lutz, O. P.; "A Semiautomatic Test . . . ;" Solid State Technology; Apr., 1969; pp. 39–43.

*Primary Examiner*—R. V. Rolinec
*Assistant Examiner*—Ernest F. Karlsen
*Attorney, Agent, or Firm*—Monte F. Mott; Wilfred Grifka; John R. Manning

[57] ABSTRACT

Trap densities in dielectric films can be determined by tunnel injection measurements when the film is incorporated in an insulated-gate field-effect transistor (IGFET). Under applied bias to the transistor gate, carriers (electrons or holes) tunnel into traps in the dielectric film. The resulting space charge tends to change channel conductance. By feeding back a signal from the source contact to the gate electrode, channel conductance is held constant, and by recording the gate voltage as a function of time, trap density can be determined as a function of distance from the dielectric-semiconductor interface. The process is repeated with the gate bias voltage at different levels in order to determine the energy distribution of traps as a function of distance from the interface.

10 Claims, 4 Drawing Figures

METHOD AND APPARATUS FOR MEASUREMENT OF TRAP DENSITY AND ENERGY DISTRIBUTION IN DIELECTRIC FILMS

ORIGIN OF THE INVENTION

The invention described herein was made in the performance of work under a NASA contract and is subject to the provisions of Section 305 of the National Aeronautics and Space Act of 1958, Public Law 85–568 (72 Stat. 435; 42 U.S.C. 2457).

BACKGROUND OF THE INVENTION

This invention relates to a method and apparatus for measuring trap densities and distribution in dielectric films.

The properties of dielectric films such as $SiO_2$ and $Si_3N_4$ used in integrated circuit devices, have an important bearing upon the ultimate performance and life expectancy of such devices. Their properties depend upon the nature and density of traps (i.e., defects in the film) unavoidably produced by various processing methods and by subsequent environmental stresses such as radiation. A trap is an energy state which may accept either or both polarities of charge (i.e., electrons or holes) depending on its exact nature. A simple and direct method for measuring trap density and distribution is useful in evaluating the quality and reliability of such films, and hence is useful in determining preferred processing techniques and limitations on device application (e.g. radiation exposure).

SUMMARY OF THE INVENTION

In accordance with the present invention, a dielectric film is incorporated into an insulated-gate, field-effect transistor (IGFET) such that the dielectric film under test forms the insulating layer between the gate and the semiconductor in which a conducting channel can exist between source and drain electrodes. First the gate electrode is shorted to the source electrode to assure the trap states above the equilibrium Fermi-energy in the dielectric are empty. Then a potential is applied between the gate and source electrodes, thus allowing carriers (electrons or holes) to tunnel into empty trap states to change the space charge in the film. To detect the change of injected space charge as a function of time, the change in relationship between channel conductance and gate bias voltage is measured as a function of time for the purpose of determining trap density as a function of distance from the interface between the dielectric film and semiconductor substrate. The time dependence of the gate voltage gives the distribution of traps as a function of distance from the dielectricsemiconductor interface. The process is repeated with the gate bias voltage at different levels in order to determine the energy distribution of traps as a function of distance from the interface.

The novel features that are considered characteristic of this invention are set forth with particularity in the appended claims. The invention will best be understood from the following description when read in connection with the accompanying drawings.

DESCRIPTION OF THE PREFERRED EMBODIMENTS

When a voltage is applied across an MDS (metal dielectric-semiconductor) structure, empty trap states in the dielectric film are energetically aligned with filled electron (or hole) states in the semiconductor, allowing electrons (or holes) to tunnel into traps in the film. The charge carried by the electrons (or holes) creates a space charge in the film which normally changes the field at the dielectric-semiconductor interface.

Figure 1:
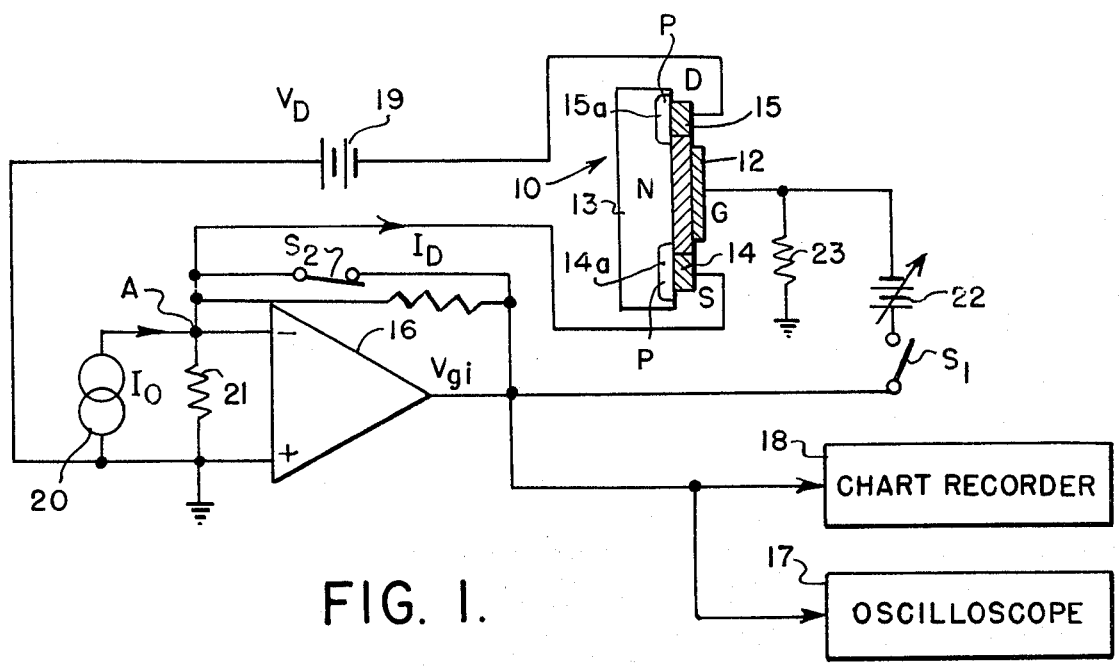
FIG. 1 is a schematic diagram illustrating the concept of the method and apparatus of the present invention.

The trap density and distribution in a dielectric film can be measured if an MDS structure is formed and incorporated in an insulated-gate, field-effect transistor (IGFET); that is, the dielectric film under test is made to form the insulating layer between the gate and the semiconductor in which a conducting channel can exist between the source and drain electrodes. A P-channel test on IGFET 10 shown in FIG. 1 is formed with a dielectric ($SiO_2$) film 11 by first forming an MDS structure comprised of a metal layer 12 deposited on the top side of the dielectric film formed on a semiconductor 13, such as N-doped silicon. Ohmic contacts 14 and 15 are deposited on heavily doped regions 14a and 15a of opposite type (P) as in the semiconductor substrate 13 to serve as source and drain contacts while the metal film 12 serves as a gate electrode. The structure to be tested is stored in a fixture which shorts the gate electrode to the source contact so that initially the trap occupancy is at equilibrium, that is, the trap states above the equilibrium Fermi-energy are empty. When some potential is initially applied between the gate and source electrodes, carriers (electrons or holes) tunnel into empty traps changing the space charge in the film, which in turn changes the channel conductance of the IGFET device.

A feedback circuit comprising a high-gain amplifier 16 senses small changes in channel conductance due to the change in space charge and adjusts the gate voltage so that channel conductance in the test IGFET 10 is maintained constant. Since channel conductance in a given device at a constant temperature depends solely upon the field at the dielectric-semiconductor interface, it follows that the interface field will also be held constant by maintaining constant the channel conductance.

As tunneling continues, the feedback voltage applied to the gate varies with time to compensate for the injected space charge. The gate voltage measured as a function of time determiness trap density as a function of distance from the semiconductor-dielectric interface. The distribution of traps over different energy levels can be determined by making a series of measurements at different gate voltage bias $V_{go}$. Each value of $V_{go}$ determines a different field at the interface. A period of time is required between each of such measurements to allow emptying of the injected charge so that equilibrium conditions are established before each succeeding measurement. Measurements are normally made with the device at liquid nitrogen temperatures to minimize unwanted thermal effects and to simplify the analysis.

The gate voltage measured as a function of time for each value of channel conductance may be recorded by photographing traces of an oscilloscope 17 for short time periods (e.g. ranging from one microsecond to 0.1 seconds) and by using a chart recorder 18 for longer periods. It is desirable to use a logarithmic time base to simplify analysis and to reduce the number of recordings required to cover the total time interval desired. The data in the form of a set of recordings or plots of gate voltage versus log time for each of several values of channel conductance can be readily analyzed to give the density and distribution of traps. The analysis makes use of the simple band model shown in FIG. 2 where the distance $x$ is equal to $a \log t + b$ where $a$ is a tunneling parameter ($\approx 2.3$A) and $b$ is a constant ($\approx 30$A).

Figure 2:
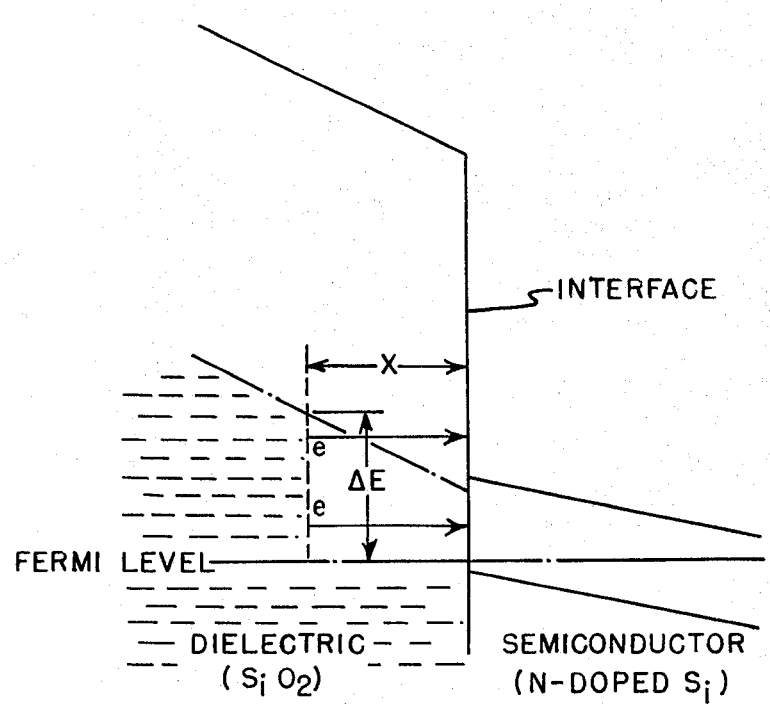
FIG. 2 is a simple band model useful in understanding the analysis of the present invention.

It can be shown that the density $N_t$ of traps per unit volume as a function of distance $x$ from the dielectric-semiconductor interface is given by $$N_t(x) = \frac{C_g}{aq} \frac{d\Delta V_g}{d \log t} \qquad (1)$$

where $C_g$ is the gate capacitance per unit area; $q$ is the elementary charge $\Delta V_g$ is the measured change in gate voltage with respect to the initial value at time zero and $t$ is the time (in seconds) after closing the test switch. $N_t(x)$ gives the total number of traps/unit volume at $x$ in the energy range $\Delta E$ from the equilibrium Fermi level as shown in FIG. 2, where $$\Delta E = q(\Delta V_s + Fx) \qquad (2)$$

$\Delta V_s$ is the change in semiconductor surface potential before and after closing the test switch (which is approximately the semiconductor band gap (1.1 volts for silicon) at liquid nitrogen temperatures) and F is the surface field determined by $I_0$.

Figure 3:
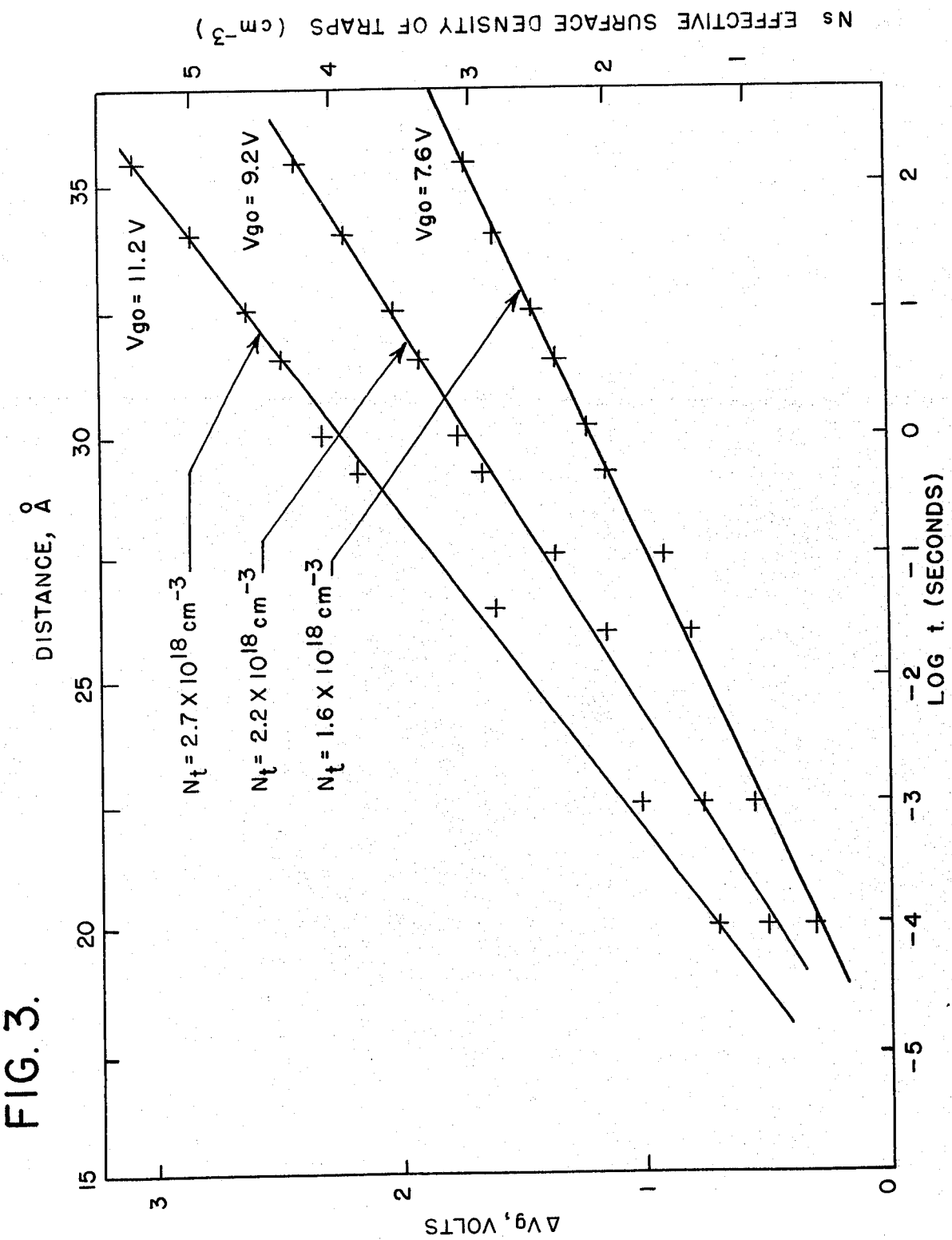
FIG. 3 is a graph of typical measurements made in accordance with the present invention to determine trap density and distribution.

It can also be shown that the density of traps per unit volume and per unit energy at $x$ and energy $\Delta E$ from the equilibrium Fermi level is given by $$\rho_t(x, \Delta E) = \frac{\epsilon}{qax} \frac{d}{dV_{go}} \left( \frac{d\Delta V_g}{d \log t} \right) \qquad (3)$$

where $\epsilon$ is the dielectric constant and $V_{go}$ is the gate voltage at time 0. Typical measurements made are shown in FIG. 3.

Operation of the basic trap density measurement circuit shown in FIG. 1 will now be described. With a selected potential applied to the gate of the test IGFET 10, a drain potential $V_D$ provided by a regulated supply 19 drives a drain current $I_D$ through the conducting channel between the source and the drain contacts. A constant current generator 20 drives a current $I_0$ into a junction A so that a small difference in current $I_D - I_0$ passes through a resistor 21. The resulting voltage drop across that resistor is applied to the input of the amplifier 16. At balance, that is, when $I_D$ equals $I_0$, the amplifier produces zero output. When $I_D$ differs from $I_0$, it produces an output voltage $V_{gi}$ that is proportional to the change in $I_D$ which corresponds to the change in channel conductance.

A selected initial bias potential $V_{go}$ is applied to the gate, G, from adjustable regulated voltage source 22 when fast electronic circuit switch $S_1$ is closed and a suitable electronic switch $S_2$ such as an MOSFET, is simultaneously opened. For a selected bias potential $V_{go}$, a current $I_0$ is adjusted to give a zero output from the amplifier immediately after closing the switch. That is a balance condition in which $I_0$ is equal to $I_D$. This balance condition is set by trial and error, i.e., by repeatedly observing the initial response and adjusting $I_0$ until this balance is achieved. This process should be performed at short time intervals so that equilibrium will be reestablished between trials. The initial balancing step is necessary to minimize the required amplifier output and thus reduce feedback error. The output voltage $V_{gi}$ at later times is then just the change in gate voltage required to compensate for the injected charge. The bias $V_{go}$ equal to the initial gate voltage after closing the switch is the unperturbed gate voltage (before space charge injection) and thus determines the field at the interface which is maintained constant during the measurement.

As time proceeds after simultaneously closing the switch $S_1$ and opening switch $S_2$, the output voltage $V_{gi}$ increases as required to compensate for the injected space charge so that the channel conductance and thus the interface field is maintained nearly constant (i.e., $I_D = I_0$). This change $\Delta V_g$ may be displayed as a function of time, or the log of time, on an oscilloscope and chart recorder, as mentioned previously.

A series of measurements at different interface fields are obtained by changing the gate bias voltage $V_{go}$ in discrete increments. Typically, $V_{go}$ might be 5 volts for the initial measurement with incremental steps of 3 volts for succeeding measurements. The actual values will depend on the dielectric film under investigation and the precision of results desired. Between measurements on a given IGFET, equilibrium is reestablished by allowing the charge to relax through a bleeder resistor 23 connected from the gate electrode to circuit ground while the switch $S_1$ is open for a period on the order of minutes to hours. The switch $S_2$ is closed during this relaxation time to avoid saturation of the amplifier prior to initiating measurement. As mentioned, all measurements are preferably made at liquid nitrogen temperatures. That is for the purpose of facilitating any calculations that may be carried out based on the measurements made.

Referring to the graph of typical measurements shown in FIG. 3, the change in gate voltage, $\Delta V_g$, is plotted as a function of log time in seconds. The scale of tunnel distance in Angstroms, which is proportional to log time, is shown across the top of the graph. The scale of effective density of traps, per unit area, $N_t$, which is proportional to $\Delta V_g$, is shown on the right. The density of traps per unit volume, $N_t$, is the slope of these curves with the values indicated in FIG. 3.

Figure 4:
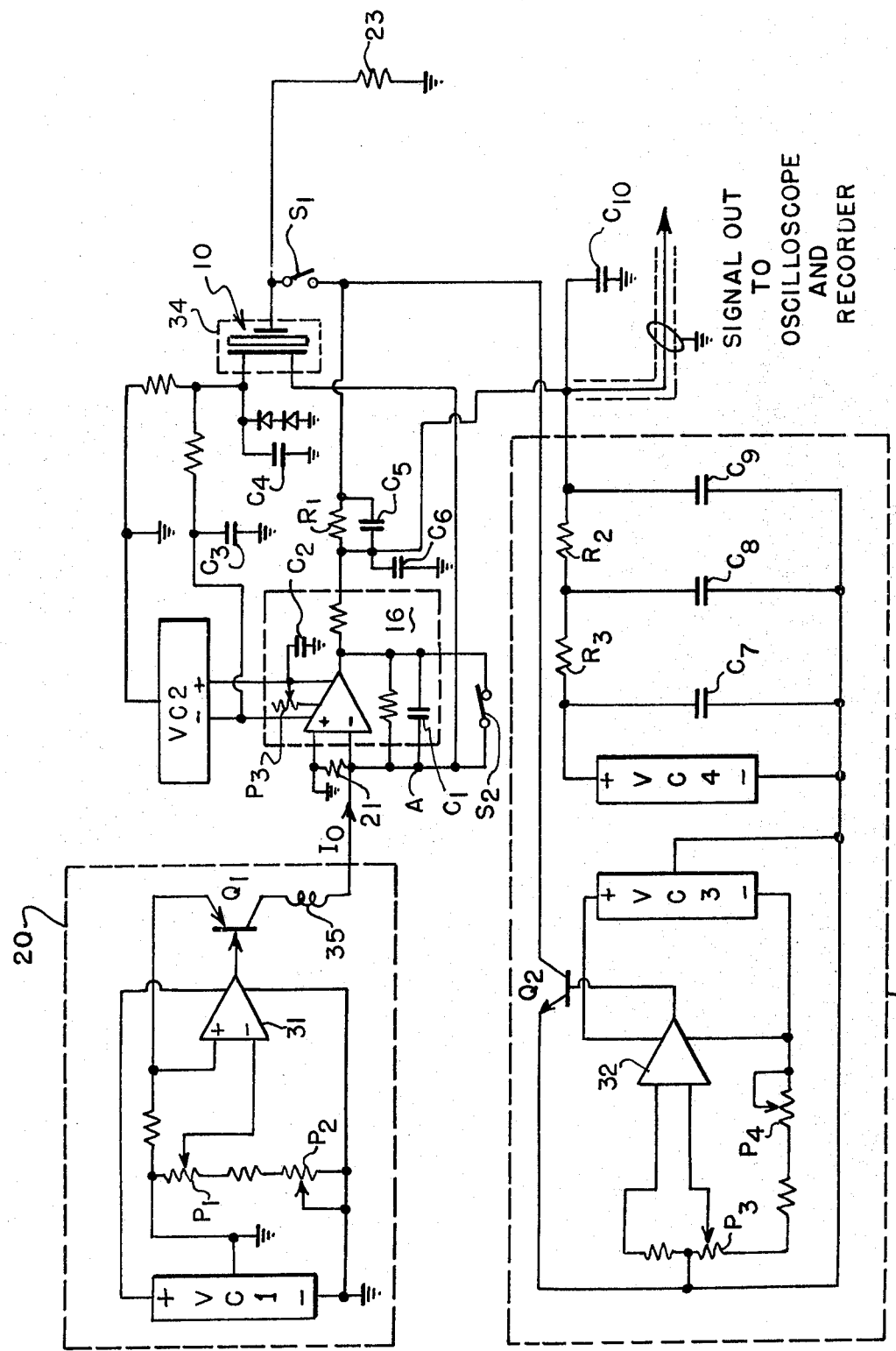
FIG. 4 is a schematic diagram of an exemplary implementation of the concept illustrated in FIG. 1.

A practical circuit for the measurement system is shown in FIG. 4 which attention is directed. Any significant drift or noise in the power supplies would affect the observed data adversely. Four separate regulated power supplies, VC1, VC2, VC3 and VC4 are therefore provided for powering the different operational amplifiers and to supply the potentials applied to the test device.

The constant current generator 20 utilizes a μA 741 frequency compensated operational amplifier 31 in conjunction with a type 2N1132 transistor $Q_1$. It is powered by power supply VC1 having a negative 15 volt terminal connected to a voltage dividing network comprising potentiometer $P_1$ connected to the inverting input terminal of amplifier 31 and a trimming potentiometer $P_2$.

The adjustable gate voltage source 22 for biasing the gate of the IGFET 10 utilizes a $\mu$A741 operational amplifier 32 and a type 2N1613 transistor $Q_2$. It is powered by a regulated voltage source VC3. The transistor $Q_2$ in turn regulates the voltage supplied by a source VC4 to the gate electrode. The amplifier 32 is in turn controlled by setting a potentiometer $P_3$ and a trimming poteniometer $P_4$. Capacitors $C_6$ through $C_9$ and resistors $R_1$ through $R_3$ form a filter network for the voltage supplied by the source VC4 to the gate electrode. It should be noted that the transistor $Q_2$ has its collector-to-emitter resistance connected in parallel with that filter network so that its conduction (set by the potentiometer $P_3$ via the amplifier 32) determines the gate voltage $V_{go}$.

The feedback amplifier 16 is a high performance type AD46J operational amplifier which is powered by a regulated source VC2. This amplifier has an extremely fast slew rate which is essential for providing the changing gate voltage requirement.

Shielding represented by a dotted line 34 is provided to prevent stray AC pickup and other noise inputs which would obscure the actual test results. Tendencies to oscillate parasitically are suppressed by the use of a 2.5mh choke coil 35 in the current supply 20 and by-pass capacitors $C_1$ through $C_5$. Filtering of the output of source VC4 provided by the large filter capacitors $C_7$, $C_8$ and $C_9$ reduces ripple to a negligible value and a 0.01 $\mu$f bypass capacitor $C_{10}$ shorts out any RF pickup.

Although particular embodiments of the invention have been described and illustrated herein, it is recognized that modifications and variations may readily occur to those skilled in the art. It is therefore intended that the claims be interpreted to cover such modifications and variations.

What is claimed is:

1. A method of determining trap densities in a dielectric film comprised of the steps of
   incorporating said dielectric film as an insulator between a layer of metal and a semiconductor substrate,
   incorporating said metal-insulator-semiconductor structure in an insulated-gate, field-effect transistor by using said metal layer as a gate electrode, and providing spaced apart ohmic contacts to regions doped opposite to said semiconductor substrate to serve as source and drain contacts,
   applying bias voltage to said source and drain contacts for current to flow through a channel of said semiconductor layer between said source and drain contacts,
   applying a bias voltage to said gate electrode, thus causing carriers to tunnel into traps in said dielectric film to create a space charge that tends to cause a change in conductance of said channel, and
   detecting said change of injected space charge by measuring the change in relationship between channel conductance and gate bias voltage applied as a function of time to determine trap density as a function of distance from the dielectric-semiconductor interface.

2. A method as defined in claim 1 wherein the density, $N_t$, of traps per unit volume as a function of distance $x$, from the interface between said dielectric film and said semiconductor substrate is calculated from the equation:

$$N_t(x) = \frac{C_g}{aq} \frac{d\Delta V_g}{d \log t}$$

where $C_g$ is the gate capacitance per unit area; $a$ is a tunneling parameter; $q$ is the elementary charge; $\Delta V_g$ is the change in gate voltage with respect to the initial value at time 0 required to maintain channel conductance constant, and $t$ is the time in seconds after applying said gate bias voltage.

3. A method as defined in claim 2 wherein the entire process is repeated with a different bias voltage applied to said gate electrode for determination of energy distribution of said traps.

4. A method as defined in claim 3 wherein the density of traps per unit volume and per unit energy at said distance $x$ is calculated from the equation:

$$\rho_t(x, \Delta E) = \frac{\epsilon}{qax} \frac{d}{dV_{go}} \left( \frac{d \Delta V_g}{d \log t} \right)$$

where $\epsilon$ is the dielectric constant, $V_{go}$ is the gate voltage at time 0.

5. Apparatus for determining trap densities in a dielectric film, where said dielectric film is incorporated as an insulator between a layer of metal and a semiconductor substrate, and where the resulting metal-insulator-semiconductor structure is incorporated in an insulated-gate, field-effect transistor by using said metal layer as a gate electrode, and providing spaced apart ohmic contacts to regions doped opposite to said semiconductor substrate to serve as source and drain contacts, said apparatus comprising
   means for applying bias voltage to said source and drain contacts for current to flow through a channel of said semiconductor layer between said source and drain contacts,
   means for applying a bias voltage to said gate electrode, thus causing carriers to tunnel into traps in said dielectric film to create a space charge that tends to cause a change in conductance of said channel,
   means for feeding back a signal from said channel to said gate electrode to hold channel conductance constant, and
   means for recording the change in gate voltage applied as a function of time to determine trap density as a function of distance from the dielectric semiconductor interface.

6. Apparatus as defined in claim 5 wherein said means for feeding back a signal from said channel to said gate electrode is comprised of
   an operational amplifier having a negative feedback circuit from its output terminal to an inverting input terminal thereof,
   a direct-current connection between said inverting input terminal and said source contact,
   a source of bias voltage, and
   a switch for additively connecting said source of bias voltage and said output terminal of said amplifier to said gate electrode.

7. Apparatus as defined in claim 6 including a second switch connected across said amplifier from said inverting input terminal to said output terminal, said second switch being adapted to be closed while said bias voltage switch is open, and to be opened when said bias voltage switch is closed.

8. Apparatus as defined in claim 7 wherein said source of bias voltage is variable.

9. Apparatus as defined in claim 8 including means for recording the output of said amplifier as a functiion of time.

10. Apparatus as defined in claim 9 wherein said recording means includes an oscilloscope for high speed recording over short periods of time and a chart recorder for low speed recording over longer periods of time.

* * * * *